US012802332B2

(12) United States Patent
Lyons et al.

(10) Patent No.: US 12,802,332 B2
(45) Date of Patent: Nov. 17, 2026

(54) METHOD OF RENDERING A TWO-DIMENSIONAL IMAGE TO A DESIGNER

(71) Applicant: Siemens Industry Software Inc., Plano, TX (US)

(72) Inventors: Alex Lyons, Girton (GB); Bruno Poltronieri, Cambridge (GB); Peter Nanson, Cambridge (GB); Richard Collins, Cambridge (GB)

(73) Assignee: Siemens Industry Software Inc., Plano, TX (US)

(*) Notice: Subject to any disclaimer, the term of this patent is extended or adjusted under 35 U.S.C. 154(b) by 223 days.

(21) Appl. No.: 18/716,863

(22) PCT Filed: Jan. 9, 2023

(86) PCT No.: PCT/US2023/010411
§ 371 (c)(1),
(2) Date: Jun. 5, 2024

(87) PCT Pub. No.: WO2023/136998
PCT Pub. Date: Jul. 20, 2023

(65) Prior Publication Data

US 2025/0029311 A1 Jan. 23, 2025

Related U.S. Application Data

(60) Provisional application No. 63/299,689, filed on Jan. 14, 2022.

(51) Int. Cl.
*G06T 15/00* (2011.01)
*G06F 30/10* (2020.01)

(52) U.S. Cl.
CPC ............ *G06T 15/005* (2013.01); *G06F 30/10* (2020.01)

(58) Field of Classification Search
CPC ........ G06T 15/503; G06T 15/04; G06T 15/30
See application file for complete search history.

(56) References Cited

U.S. PATENT DOCUMENTS 6,137,497 A 10/2000 Strunk et al.
2008/0062197 A1 3/2008 Bi et al.
(Continued)

OTHER PUBLICATIONS

Joldes et al.; "Tight and Rigorous Error Bounds for Basic Building Blocks of Double-Word Arithmetic;" ACM Transactions on Mathematical Software, vol. 44, No. 2, Article 15res. Publication date: Oct. 2017 (Year: 2017).*
(Continued)

*Primary Examiner* — Tammy Goddard
(74) *Attorney, Agent, or Firm* — Lempia Summerfield Katz LLC

(57) ABSTRACT

A computer-implemented method is provided for rendering, to a designer, a two-dimensional image of an assembly of part instances in a three-dimensional assembly space within a computer-aided design (CAD) system utilizing double precision to describe part assemblies. Such assemblies are considered to be distant from a nominal observer. A viewport on a two-dimensional image plane is defined, and a combined transform is defined in quadruple precision to enable the generation of clipping lines and/or clipping points. The clipping lines and clipping points clipping the faces and edges of the part instance in the assembly to the portion of the assembly that lies within the viewport.

16 Claims, 4 Drawing Sheets

(56) References Cited

U.S. PATENT DOCUMENTS

| | | | | |
|---|---|---|---|---|
| 2017/0180756 | A1* | 6/2017 | Tuffreau | H04N 13/161 |
| 2021/0166338 | A1* | 6/2021 | Cerny | G06T 1/20 |
| 2022/0019431 | A1* | 1/2022 | Kaul | G06F 7/483 |

OTHER PUBLICATIONS

David Eck, "Introduction to Computer Graphics," Dec. 1, 2021, Retrieved from the Internet: URL:https://math.hws.edu/eck/cs424/downloads/graphicsbook.linked.pdf, pp. 1-456.

Search Report and Written Opinion for PCT/US2023/010411, mailed Apr. 28, 2023, pp. 1-14.

* cited by examiner

METHOD OF RENDERING A TWO-DIMENSIONAL IMAGE TO A DESIGNER

The present patent document is a § 371 nationalization of PCT Application Serial No. PCT/US2023/010411, filed Jan. 9, 2023, designating the United States, and this patent document also claims the benefit of U.S. Provisional Patent Application No. 63/299,689, filed Jan. 14, 2022, which are hereby incorporated by reference in their entireties.

TECHNICAL FIELD

The present disclosure relates to a computer-implemented method of rendering, to a designer, a two-dimensional image of an assembly of part instances in a three-dimensional assembly space within a computer-aided design (CAD) system utilizing double precision to describe part assemblies, wherein each part instance in the assembly is associated with its own proto-space and a transform that transforms the part instance from its proto-space to the assembly space.

BACKGROUND

Computer-Aided Design (CAD) techniques are used widely in many fields of product design. They enable a designer not just to generate designs in three-dimensions from a wide variety of parts and assemblies of part instances, but to visualize elements of these designs in both two- and three-dimensions at various points during the design process. A designer may wish to render elements of the design as a two-dimensional image following the execution of an operation during the design process or once the design process is completed. Rendering systems provided as part of CAD software require a broad range of capabilities, since the region of interest to be rendered in two-dimensions may have a wide variety of features or properties. One example of this is the situation where part instances in an assembly contain small-scale details and features, such as surface texture or topography, yet the part instances themselves are at large distances from each other or a nominal viewpoint of an observer. A large distance is several orders of magnitude greater than the dimensions of the detail or feature of interest, thus requiring the rendering system to be able to accurately depict image components where the relative size and/or position of part instances may differ widely. It may be useful for a designer to be able to specify one or more "viewports," (i.e., regions where the designer requires rendered output). Any face or edge of a part instance that occurs within the viewport will be rendered, and any face or edge that occurs outside of the viewport will not be rendered. Any faces or edges that intersect the boundary of the viewport may be rendered or may be clipped to the viewport, with clip lines and clip points output to an underlying graphics system showing where the face or edge occurrences are clipped. A line meeting the boundary of a viewport will be clipped at a clipping point such that only the portion within the viewport is rendered. A face trimmed by a viewport face will be clipped at a clipping line. A clipping line may be a curve, (e.g., formed of multiple linear segments), constructed for the rendering process.

The viewport itself is a region of the two-dimensional image plane that may correspond to a right-angled quadrilateral, such as a square or rectangle covering only the region where a designer wishes to have a rendered image. It is also possible to define three-dimensional viewports as a region in assembly space. A designer has a choice of two types of rendering: parallel rendering, where all of the features of an assembly within the viewport are viewed at actual size; and perspective rendering, where all of the features are rendered based on their perspective from a nominal viewpoint. These two types of rendering are illustrated schematically in FIGS. 1*a* and 1*b*.

FIG. 1*a* is a schematic illustration of two-dimensional parallel rendering. A designer in the process of working on an assembly of part instances 1 wishes to have a portion 2 of the assembly rendered in parallel in a two-dimensional image plane 3 following the completion of an operation. The designer defines a quadrilateral viewport 4 on the two-dimensional image plane 3 and a view direction D in vector format. The view direction D lies parallel to the surface normal N of the two-dimensional image plane 3 in which the viewport 4 is placed. Four viewport planes 5*a*, 5*b*, 5*c*, 5*d* are parameterized by a set of points and parallel to the view direction D and extending from each edge of the viewport 4. Since any feature of the assembly of part instances 1 falling within the viewport 5 will be rendered as its true size, the viewport 4 and viewport planes 5*a*, 5*b*, 5*c*, 5*d* form five sides of an infinitely long cuboid.

FIG. 1*b* is a schematic illustration of two-dimensional perspective rendering. A designer in the process of working on an assembly of part instances 6 wishes to have a portion 7 of the assembly rendered in perspective in a two-dimensional image plane 8 following the completion of an operation. The designer defines a quadrilateral viewport 9 on the two-dimensional image plane 8 and a nominal viewpoint 10, known as the eye point, at which a hypothetical observer of the two-dimensional image plane 8 is placed. Four viewport planes 11*a*, 11*b*, 11*c*, 11*d* are parameterized by a set of points and extending from each edge of the viewport 9 to an apex at the viewpoint 10, forming an infinitely long pyramid.

In addition to the constraints placed on the rendering system by the potential differences in relative size and position of features within an assembly of part instances, the precision of the operation of the CAD system may create an issue in obtaining accurate visibility calculations. CAD systems may operate to double precision, which is based on the IEEE 754 double-precision binary floating-point format, otherwise known as binary64. A sixty-four bit string is split into a single sign bit (bit 63 eleven exponent bits (bits 62 to 52) representing an unsigned integer from 0 to 2047, and fifty-two fraction bits (bits 51 to 0) representing a significand precision of fifteen significant digits. For CAD systems, while the use of double precision is attractive from a computing cost perspective, the use of double precision limits the precision of calculations as only fifteen significant digits are available. One effect of this is to limit the valid volume for assemblies of part instances and the three-dimensional points that define the parameterization of the viewport planes due to the loss of precision when generating relative transforms. This limitation effectively defines a system operating region, within which although the precision of calculations may be limited, they are acceptable. In certain CAD environments, such as the Parasolid PLM software, available at https://www.plm.automation.siemens.com/global/en/products/plm-components/parasolid.html, the normal range of calculation is $10^{11}$. Outside of the system operating region, the intersections between the viewport planes and face occurrences within the part instances within an assembly are not robust or accurate to the required precision. This is a particular issue if a face contains a feature that is of the order of or marginally larger than the system precision. If such a feature were to fall close to the boundary of the viewport, the feature may end up being clipped incorrectly or determined to be on the wrong side of a viewport plane, leading to an incorrect visibility calculation.

One way in which this may be dealt with is to employ quadruple precision throughout the CAD system. This may be using the IEEE 745-2008 128-bit base-2 format, binary 128, which includes a single sign bit (bit 127), fifteen exponent bits (bits 126 to 112) representing an unsigned integer from 0 to 16382, and one hundred and twelve fraction bits (bits 111 to 0), representing a significand precision of thirty-four significant digits, or by using a technique known as "double-double arithmetic," where pairs of double precision values are used. While quadruple precision improves the accuracy of calculations, quadruple precision comes at a high computing cost, both in terms of resources and time. Aside from increased calculation times, unless increased processing power and memory space are available, any existing CAD model in double precision will need to be rewritten to operate at quadruple precision, which in itself is highly labor intensive and therefore unattractive to designers. Using double-double arithmetic is limited in the magnitude of the values represented compared with quadruple precision as the number of exponent bits is still only eleven compared with fifteen. While some calculations below a particular exponent size may be only slightly less precise in double-double arithmetic than in quadruple precision, at larger values this is not the case.

As an alternative approach, a viewport may be constructed in a viewing space and multiple instances of the viewport created by transforming it into each proto-space of the proto-spaces of the untransformed part instances in the assembly. The proto-space of the part, also known as the part space or entity proto-space is the space the part instance exists in before any transforms to an assembly space are applied. The proto-space is a local co-ordinate space to the part instance as opposed to the global assembly space of the assembly. While this does not result in the high computing cost of converting an entire model to quadruple precision, the transformed points used to parameterize the viewport planes may still lie outside of the valid volume of the part instance and subject to the issues with visibility calculations outlined above.

SUMMARY

The scope of the present disclosure is defined solely by the appended claims and is not affected to any degree by the statements within this summary. The present embodiments may obviate one or more of the drawbacks or limitations in the related art.

The present disclosure aims to address these issues by providing, in a first instance, a computer-implemented method of rendering, to a designer, a two-dimensional image of an assembly of part instances in a three-dimensional assembly space within a computer-aided design (CAD) system utilizing double precision to describe part assemblies, wherein each part instance in the assembly is associated with its own proto-space and a transform that transforms the part instance from its proto-space to the assembly space.

The method includes receiving a definition of a two-dimensional image plane in which to view a two-dimensional rendered image and either a viewpoint from which to view the two-dimensional rendered image or a view direction; and a viewport lying in the two-dimensional image plane and representing a desired portion of the two-dimensional image plane that a designer wishes to view. The method further includes defining, in a viewport proto-space, the parameterization of a set of viewport planes that extend from the viewport towards the viewpoint or parallel to the view direction to create a three-dimensional form by selecting a point in each of the viewport planes, the set of viewport planes and the viewport being associated with a transform from the viewport proto-space to the assembly space. The method further includes generating, in quadruple precision, a combined transform including: the transform associated with the part instance in the assembly; the transform associated with the viewport and the set of viewport planes; and a transform to scale and/or translate the viewport and the set of viewport planes. The method further includes operating on the combined transform and the points defining the viewport planes in double precision to intersect the faces and/or edges of at least one part instance in the assembly with at least one of the viewport planes to generate clipping lines and/or clipping points, wherein the clipping lines and clipping points clip the faces and edges of the part instance in the assembly to the portion of the assembly that lies within the viewport. The method further includes outputting the rendering of a two-dimensional image of the assembly of part instances, wherein the clipping lines and/or clipping points are used to restrict the rendering to the portions of the assembly that lie within the viewport.

The embodiments described below map the assembly clipping problem into a series of sub-problems for each proto-space in which all geometric entities are within the valid assembly volume, by using a suitable combined transform in quadruple precision. This enables a robust calculation of the clipping of the rendered assembly without loss of accuracy when part instances within the assembly are a very distant from the nominal observer.

The transform associated with the part instance in the assembly and the transform associated with the viewport and the set of viewport planes may be provided in quadruple precision. Alternatively, the transform associated with the part instance in the assembly and the transform associated with the viewport and the set of viewport planes may be upgraded to quadruple precision.

The two-dimensional image may be rendered as a perspective view, where an eye point defining the position of an observer at the viewpoint is also received, and where the three-dimensional form is a pyramid having the viewport at its base and the eye point at its apex. In this situation, the combined transform includes the transform associated with the part instance in the assembly, the transform associated with the viewport and the set of viewport planes, and a transform to scale the viewport and the set of viewport planes.

Alternatively, the two-dimensional image may be rendered as a parallel view where the three-dimensional form is a prism having the viewport as its base. The two-dimensional image may be rendered as a parallel view where the three-dimensional form is a cuboid having the viewport as its base. In both of these situations, the combined transform includes: the transform associated with the part instance in the assembly; the transform associated with the viewport and the set of viewport planes; and a transform to translate the viewport and the set of viewport planes. The view direction may lie parallel to the surface normal of the two-dimensional image plane.

The valid volume for the assembly space and the points defining the parametrization of the viewport planes may be limited to a system operating region, where at least one of the part instances in the assembly lies outside of the system operating region.

One of the faces of the part instance in the assembly may be clipped to the viewport contains a feature of interest.

Quadruple precision may be employed only when generating the combined transform.

In a second aspect, embodiments of the present disclosure also provide a computer program including instructions that when executed on a computer cause the computer to carry out the acts outlined above.

In a third aspect, embodiments of the present disclosure also provide a data processing system configured to render, to a designer, a two-dimensional image of an assembly of part instances in a three-dimensional assembly space within a computer-aided design (CAD) system utilizing double precision to describe part assemblies, wherein each part instance in the assembly is associated with its own proto-space and a transform that transforms the part instance from its proto-space to the assembly space.

The data processing system includes a designer input device configured to receive a definition of a two-dimensional image plane in which to view a two-dimensional rendered image and either a viewpoint from which to view the two-dimensional rendered image or a view direction; and a viewport lying in the two-dimensional image plane and representing a desired portion of the two-dimensional image plane that a designer wishes to view.

The data processing system further includes a data processor configured to define, in a viewport proto-space, the parameterization of a set of viewport planes that extend from the viewport towards the viewpoint to create a three-dimensional form by selecting a point in each viewport plane of the set of viewport planes, the viewport and the set of viewport planes being associated with a transform from the viewport proto-space to the assembly space. The data processor is further configured to generate, in quadruple precision, a combined transform including: the transform associated with the part instance in the assembly; the transform associated with the viewport and the set of viewport planes; and a transform to scale and/or translate the viewport and the set of viewport planes. The data processor is further configured to operate on the combined transform and the points defining the viewport planes in double precision to intersect the faces and/or edges of at least one part instance in the assembly with at least one of the viewport planes to generate clipping lines and/or clipping points, wherein the clipping lines and clipping points clip the faces and edges of the part instance in the assembly to the portion of the assembly that lies within the viewport.

The data processing system further includes a graphics system configured to output a rendering of a two-dimensional image of the assembly of part instances, wherein the clipping lines and/or clipping points are used to restrict the rendering to the portions of the assembly that lie within the viewport.

The data processor may be further configured to employ quadruple precision only when generating the combined transform.

BRIEF DESCRIPTION OF THE DRAWINGS

The disclosure is now described by way of example only, and with reference to the accompanying drawings, in which.

DETAILED DESCRIPTION

Figure 1A:
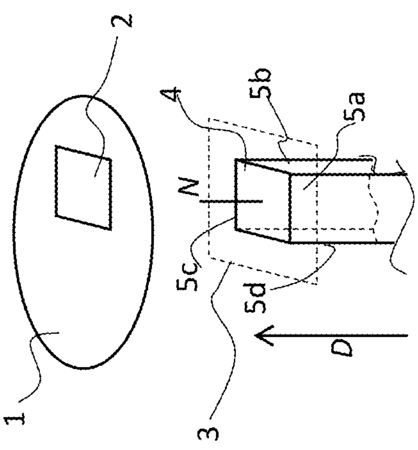
FIG. 1*a* is a schematic illustration of two-dimensional parallel rendering.
Figure 1B:
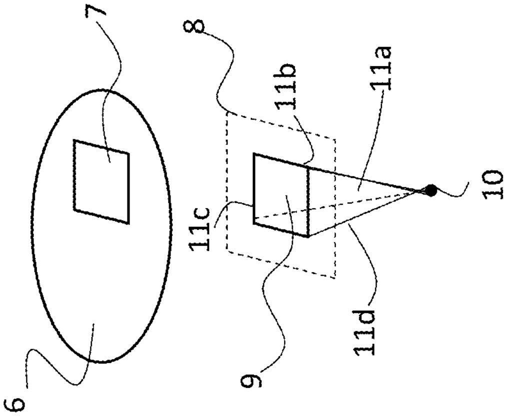
FIG. 1*b* is a schematic illustration of two-dimensional perspective rendering.

To overcome the limitations of the system operating region when rendering two-dimensional images described above, embodiments of the present disclosure employ the concept of generating a combined transform in the rendering process in quadruple precision, while retaining double precision for the remainder of the design within the CAD system. The combined transform is operated on the points defining the viewport planes to intersect the faces and/or edges of at least one part instance in the assembly with at least one of the viewport planes to generate clipping lines and/or clipping points. When compared with the case where both the points defining the viewport plane parametrization and the part instances being rendered are all within the system operating region, embodiments of the disclosure show no loss of accuracy when used when the points defining the plane parametrization of the viewport specified by the designer or the part instances being rendered are outside the system operating region.

The embodiments of the present disclosure are used when rendering, to a designer, a two-dimensional image of an assembly of part instances in a three-dimensional assembly space within a computer-aided design (CAD) system utilizing double precision to describe part assemblies. Each part instance in the assembly is associated with its own proto-space and a transform that transforms the part instance from its proto-space to the assembly space. Initially, a definition of a two-dimensional image plane in which to view a two-dimensional rendered image and either a viewpoint from which to view the two-dimensional rendered image or a view direction; and a viewport lying in the two-dimensional image plane and representing a desired portion of the two-dimensional image plane that a designer wishes to view are received. These may be input by a designer or taken from designer preferences that have been defined previously or earlier in the design process, depending upon the workflow of the design process in use.

Once these boundaries for the rendering process have been received, the parameterization of a set of viewport planes that extend from the viewport towards the viewpoint to create a three-dimensional form are defined in a viewport proto-space by selecting a point in each viewport plane of the set of viewport planes. The set of viewport planes and viewport are associated with a transform from the viewport proto-space to the assembly space. Up until this point, everything has been defined in double precision, although it is possible that the transforms associated with the part instance, the viewport and the scaling and/or translation may be provided in quadruple precision or alternatively upgraded to quadruple precision.

Now, however, a combined transform is generated in quadruple precision. The combined transform includes: the transform associated with the part instance in the assembly; the transform associated with the viewport and the set of viewport planes; and a transform to scale and/or translate the viewport and set of viewport planes. Once the combined transform has been generated, it is operated on the points defining the viewport planes in double precision to intersect the faces and/or edges of at least one part instance in the assembly with at least one of the viewport planes to generate clipping lines and/or clipping points, the clipping lines and clipping points clipping the faces and edges of the part instance in the assembly to the portion of the assembly that lies within the viewport. Although the combined transform itself is in quadruple precision, the parameterization of the viewport planes remains in double precision, as do 13 liping lines and/or clipping points. Finally, the rendering of the two-dimensional image of the assembly of part instances is output. The clipping lines and/or clipping points are used to restrict the rendering to the portions of the assembly that lie within the viewport.

Figure 2:
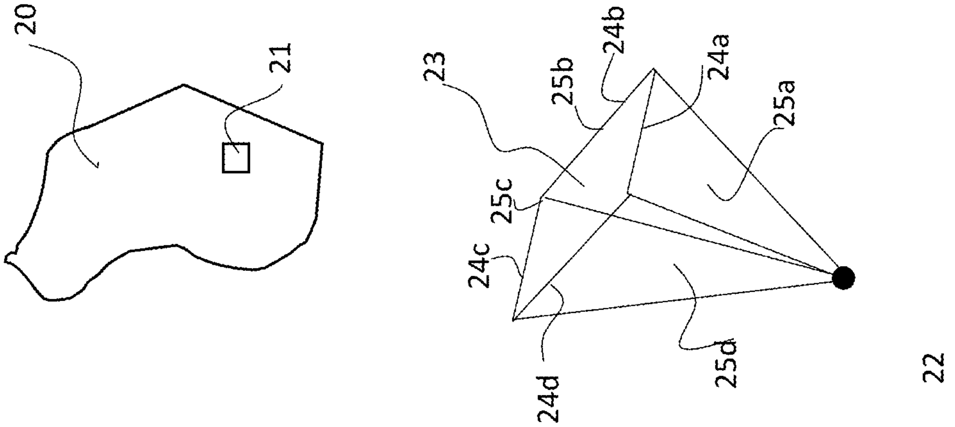
FIG. 2 is a schematic illustration of an example of an assembly of part instances to be rendered as a two-dimensional image in perspective.

The embodiments of this method are now described in more detail. FIG. 2 is a schematic illustration of an assembly of part instances to be rendered as a two-dimensional image in perspective. The assembly 20 of part instances includes at least one part instance 21, which may be any three-dimensional form having faces connected by edges. For example, the assembly may be the layout of a manufacturing line, where there is a need to be able to plan factory floorspace and positioning of elements including parts such as robots, storage, or workstations to maximize manufacturing efficiency as well as health and safety of workers. Each part instance 21 sits in its own proto-space, which is a local part space in which the part instance sits before any transforms are applied during modelling operations to generate the design. Each part instance is also associated with a transform that transforms the part instance from its proto-space to the assembly space.

A viewpoint 22 is selected as the eye point of a nominal observer. The two-dimensional image plane p is provided with a viewport 23, which in this example is rectangular with two opposing long edges 24*d*, 24*b* and two opposing short edges 24*c*, 24*a*. Points parameterizing a set of viewport planes 25*a*, 25*b*, 25*c*, 25*d* are defined such that each viewport plane 25*a*, 25*b*, 25*c*, 25*d* extends from an associated edge 24*a*, 24*b*, 24*c*, 24*d* of the viewport and connect at an apex defined by the viewpoint 22.

The viewport 23 and the set of viewport planes 25*a*, 25*b*, 25*c*, 25*d* are each defined in their own proto-space, which is independent of the proto-space of the part instances 21. The view port 23 and the set of viewport planes 25*a-d* are associated with a transform from the viewport proto-space to the assembly space. A point 26 in the middle of the viewport plane 25*a* is chosen for parameterization rather than the viewpoint 22 as the eye point of the nominal observer remains at a fixed point in the subsequent imaging calculations. However, in other examples, the point 26 may be located at any position in the viewport plane 25*a*, not necessarily the center.

In one example, each transform is defined in double precision, and therefore requires conversion to quadruple precision on generating the combined transform, which is described below. Alternatively, the transforms are defined in quadruple precision, and may therefore be combined without any modification. As described further below, the precision in which the scaling and/or translation transforms prior to the generation of the combined transform are defined is not limiting.

Figure 3:
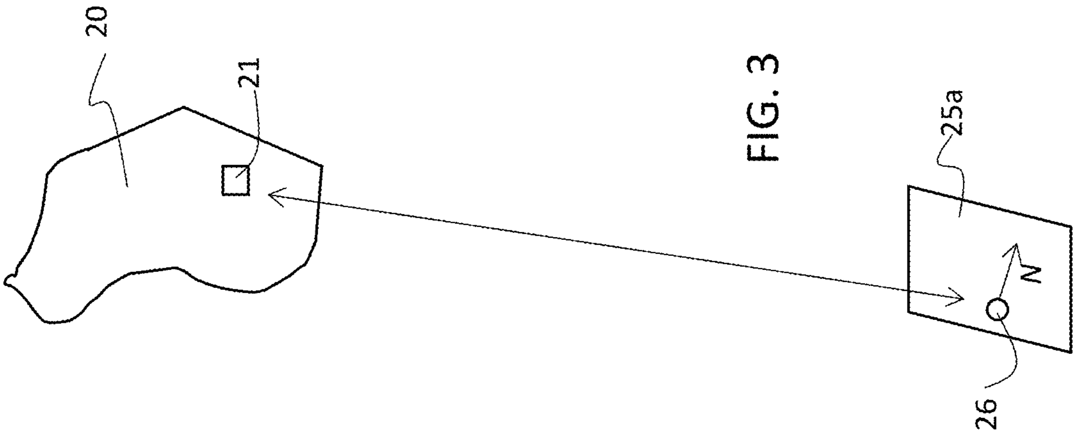
FIG. 3 is a second schematic illustration of an example of an assembly of part instances to be rendered as a two-dimensional image in perspective, based on FIG. 2.

FIG. 3 is a second schematic illustration of an assembly of part instances to be rendered as a two-dimensional image in perspective, based on FIG. 2. FIG. 3 shows the situation where the assembly 20 of part instances 21 is positioned a large distance away from the point 26 parameterizing the viewport plane 25*a*. The viewport plane 25*a* is positioned within the system operating region, but the assembly 20 of part instances 21 is positioned outside of the system operating region. A point 26 within the viewport plane 25*a* and surface normal vector N defining the viewport plane 25*a* and parameterization are shown. Should visibility calculations be formed at this point with the appropriate transforms defined in double precision only, they will be incorrect. For example, a small feature of a part instance that lies close to one of the edges of the viewport 23 may end up being clipped incorrectly or determined to be on the wrong side of a viewport plane 25*a*. However, by generating a combined transform that when operated on the point 26 on the viewport plane 25*a* in quadruple precision, even though the parameterization of the viewport plane 25*a* is defined in double precision, the point 26 parameterizing the viewport plane 25*a* and the part instance 21 being rendered are both within the operating region.

Figure 4:
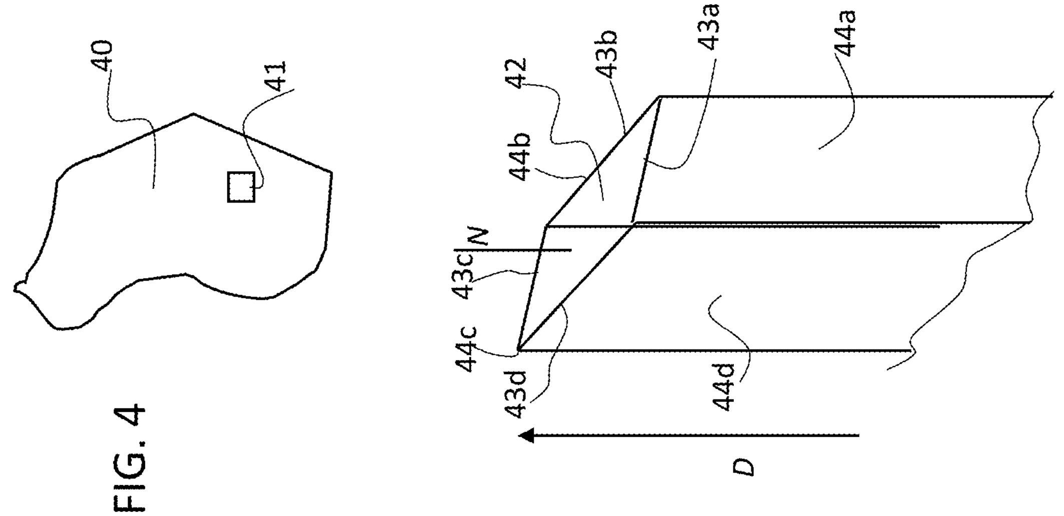
FIG. 4 is a schematic illustration of an example of an assembly of part instances to be rendered as a two-dimensional image in parallel.

FIG. 4 is a schematic illustration of an assembly of part instances to be rendered as a two-dimensional image in parallel. The assembly 40 of part instances includes at least one part instance 41, which may be any three-dimensional form having faces connected by edges. Each part instance 41 sits in its own proto-space, which is a local part space in which the part instance sits before any transforms are applied during modelling operations to generate the design. Each part instance is also associated with a transform that transforms the part instance from its proto-space to the assembly space. A view direction D is provided indicating the direction in which the designer wishes to view the assembly 40 of part instances 41 when rendered as a two-dimensional image.

The two-dimensional image plane p is provided with a viewport 42, which in this example is rectangular with two opposing long edges 43*d*, 43*b* and two opposing short edges 43*c*, 43*a*. Points parameterizing a set of viewport planes 44*a*, 44*b*, 44*c*, 44*d* are defined such that each viewport plane 44*a*, 44*b*, 44*c*, 44*d* extends from an associated edge 43*a*, 43*b*, 43*c*, 43*d* of the viewport 42. However, unlike the example shown in FIG. 2, to render the assembly 40 of part instances 41 in parallel there is no eye point, and rather than connecting at a viewpoint the set of viewport planes 44*a*, 44*b*, 44*c*, 44*c* form a cuboid having an infinite length. Again, the viewport 42 and viewport planes 44*a*, 44*b*, 44*c*, 44*d* are each defined in their own proto-space, which is independent of the proto-space of the part instances 41. The viewport 43 and the set of viewport planes 44*a-d* are associated with a transform from the viewport proto-space to the assembly space. A point 45 in the middle of the plane 44*a* is chosen for parameterization.

However, in other examples, the point 45 may be located at any position in the viewport plane 44*a*, not necessarily the center. In one example, each transform is defined in double precision, and therefore requires conversion to quadruple precision on generating the combined transform, which is described below. Alternatively, the transforms are defined in quadruple precision, and may therefore be combined without any modification. As described further below, the precision in which the scaling and/or translation transforms prior to the generation of the combined transform are defined is not limiting.

Figure 5:
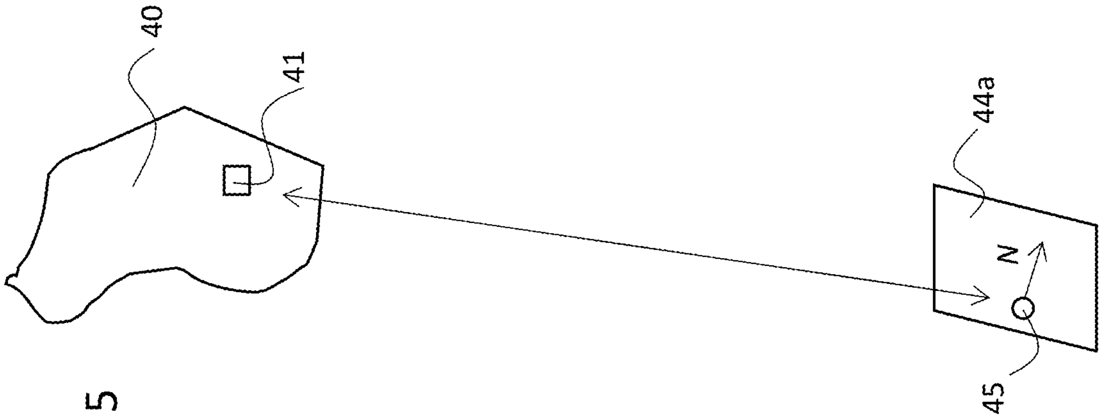
FIG. 5 is a second schematic illustration of an example of an assembly of part instances to be rendered as a two-dimensional image in parallel, based on FIG. 4.

FIG. 5 is a second schematic illustration of an assembly of part instances to be rendered as a two-dimensional image in parallel, based on FIG. 4. FIG. 5 shows the situation where the assembly 40 of part instances 41 is positioned a large distance away from the point 45 parameterizing the viewport plane 44*a*. The viewport plane 44*a* and point 45 are positioned within the system operating region, but the assembly 44 of part instances 41 is positioned outside of the system operating region. A point 45 within the viewport plane 44*a* and surface normal vector N defining the viewport plane 44*a* and parameterization are shown. Should visibility calculations be formed at this point with the appropriate transforms defined in double precision only, they will be incorrect. For example, a small feature of a part instance that lies close to one of the edges of the viewport 42 may end up being clipped incorrectly or determined to be on the wrong side of a viewport plane 44*a*.

However, by generating a combined transform that when operated on the point 45 on the viewport plane 44*a* in quadruple precision, even though the parameterization of the viewport plane 44 is defined in double precision, the point 45 parameterizing the viewport plane 44*a* and the part instance 41 being rendered are both within the operating region. In this example, the view direction D lies parallel to the surface normal N of the two-dimensional image plane. However, the view direction D may be at an angle α to the surface normal N of the two-dimensional image plane, where α<90° to the surface normal N.

Figure 6:
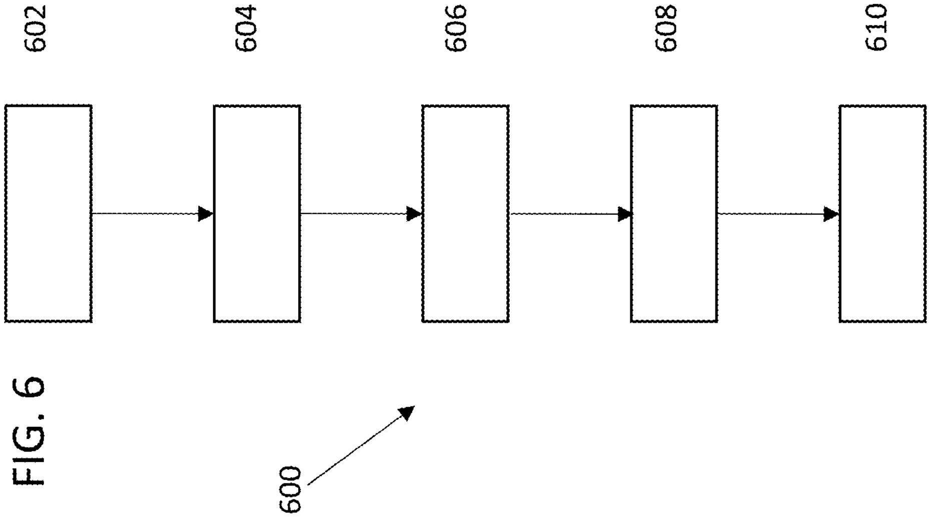
FIG. 6 is a flow chart illustrating a method in accordance with an embodiment of the present disclosure.

FIG. 6 is a flow chart illustrating a method in accordance with an embodiment of the present disclosure. The computer-implemented method 600 results in the rendering of a two-dimensional image of an assembly of part instances in a three-dimensional assembly space within a computer-aided design (CAD) system. Such a CAD system utilizes double precision to describe part assemblies, wherein each part instance in the assembly 20, 40 is associated with its own proto-space and a transform that transforms the part instance 21, 41 from its proto-space to the assembly space.

At act 602, a definition of a two-dimensional image plane p in which to view a two-dimensional rendered image and either a viewpoint 22 from which to view the two-dimensional rendered image or a view direction D; and a viewport 23, 42 lying in the two-dimensional image plane p and representing a desired portion of the two-dimensional image plane that a designer wishes to view are received. These definitions may be received from a designer input device and input by the designer as and when the designer wishes to render a two-dimensional image or may be received from elsewhere within the CAD system. For example, designer preferences may be stored in an associated memory and retrieved at the point the designer clicks on an icon or menu provided on a display device associated with the CAD system. Alternatively, the definitions may be set as a system preference or provided via an API linking to a separate software program.

At act 604, the method moves on to defining, in a viewport proto-space, the parameterization of a set of viewport planes 25*a-d*, 44*a-d*, that extend from the viewport 23, 42 towards the viewpoint 22 or parallel to the view direction D to create a three-dimensional form by selecting a point in each viewport plane of the viewport planes 25*a-d*, 44*a-d*. The viewport 23, 43 planes 25*a-d*, 44*a-d* are associated with a transform from the viewport proto-space to the assembly space.

At act 606, a combined transform is generated in quadruple precision. This combined transform includes: the transform associated with the part instance 21, 41 in the assembly 20, 40; the transform associated with the viewport 23, 43 and the set of viewport planes 25*a-d*, 44*a-d*; and a transform to scale and/or translate the viewport 23, 42 and the set of viewport planes 25*a-d*, 44*a-d*.

When the designer requires a perspective view, a transform to scale the viewport 23 and the set of viewport planes 25*a-d* is used, since this provides the element of perspective in relation to the size of any features of the part instance 21. It may also be necessary to include a transform to translate the viewport 23 depending on the distance between the viewport 23 and the assembly 20 of part instances 21.

When the designer requires a parallel view a transform to translate the viewport 42 and the set of viewport planes 44*a-d* is used, since this retains the original size of any features of the part instance 21. As described earlier, the component transforms may be provided in quadruple format or may be upgraded to quadruple format in order to generate the combined transform having otherwise been provided or stored in double precision. This upgrading process is described in greater detail below.

Figure 7A:
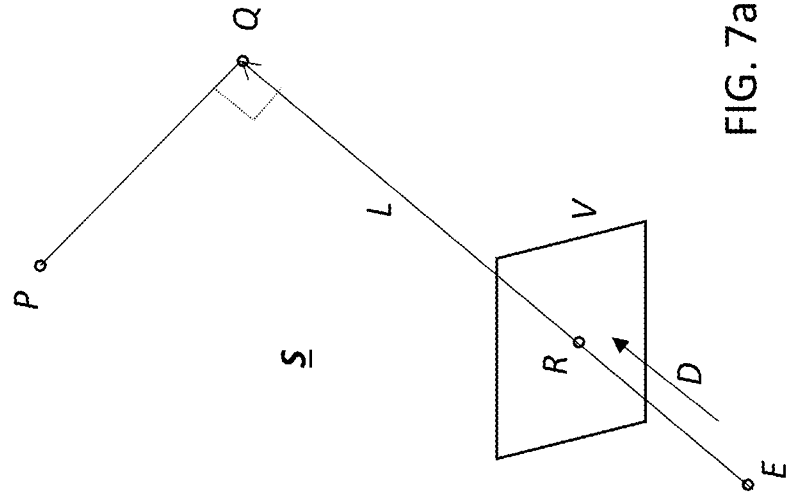
FIG. 7*a* is a schematic illustration of the function of the scaling transform in a perspective rendering, in accordance with an embodiment of the present disclosure.

FIG. 7*a* is a schematic illustration of the function of the scaling transform in a perspective rendering. A viewpoint is formed by the eye point E, which is transformed to the assembly space and fixed. A line L from the eye point E to the viewport plane V intersects the viewport plane V at the point R. A part instance origin P is projected onto the line L to obtain the point Q to form the apparent position of the part instance origin P when viewed in perspective. This transformation is described by the scaling transform with scale $$S = \frac{|Q-E|}{|R-E|}.$$

Figure 7B:
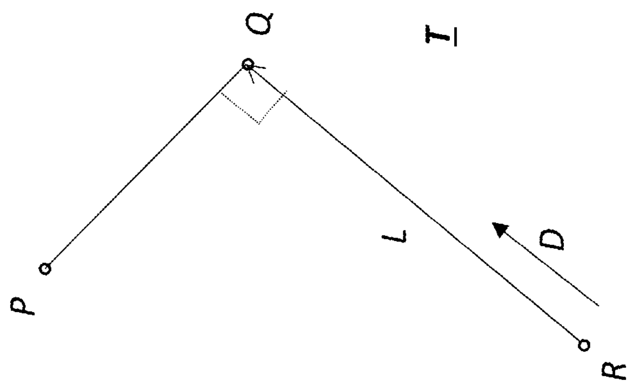
FIG. 7*b* is a schematic illustration of the function of the translation transform in a parallel rendering, in accordance with an embodiment of the present disclosure.

FIG. 7*b* is a schematic illustration of the function of the translation transform in a parallel rendering. A line L extends from a point R representing the viewport origin transformed to assembly space parallel to the view direction D. A part instance origin P is projected onto the line L to obtain the point Q to form the apparent position of the part instance origin P when viewed in parallel. This transformation is described by the translation transform with translation vector T=Q–R. Since the purpose of both the scaling and the translation transformations is to move the part instance origin P from one position that is a relatively large distance away from the viewport to another, the accuracy of the transform itself is not critical. This means it may be provided in single, double, or quadruple precision, dependent on the designer and the origin of the transform within the design workflow. If not provided in quadruple precision, an upgrading process to enable the generation of the combined transform is required.

In the examples given above, the viewpoint is chosen as the eye point in a perspective rendering, and therefore in a fixed position. However, depending on the purpose of the rendering the designer may require placing the viewpoint in a position that is independent of the eye point, for example, at distance away to understand what a second viewer would experience from the same perspective rendering. In this situation, both a scaling transform S and a translation transform T are required to generate the combined transform.

Once the combined transform has been generated in quadruple precision, act 608 may take place. At act 608, the combined transform and the points defining the viewport planes 25_a-d_, 44_a-d_, in double precision, are operated on to intersect the faces and/or edges of at least one part instance 21, 41 in the assembly 20, 40 with at least one of the viewport planes 25_a-d_, 44_a-d_ to generate clipping lines and/or clipping points. The intersection calculations themselves are carried out in double precision. In other words, quadruple precision is employed only at the point the combined transform is generated. The clipping lines and clipping points clip the faces and edges of the part instance in the assembly to the portion of the assembly that lies within the viewport.

At act 610, the rendering of a two-dimensional image of the assembly 20, 40 of 21, 41 is output. The clipping lines and/or clipping points are used to restrict the rendering to the portions of the assembly 20, 40 that lie within the viewport 23, 42. One of the faces of the part instance 21, 41 in the assembly 20, 40 may contain a feature of interest. If this is the case, using the method 600 results in the imaging calculations required to render the feature, even if it lies on the boundary of the viewport 23, 42, being correct.

Although the transforms that constitute the combined transform may be provided in quadruple precision, in order to keep any associated computing cost to a minimum, it is desirable that the CAD system employs double precision throughout, meaning that these transforms will need to be upgraded to quadruple precision for the combined transform to be generated. The transforms themselves are represented as matrices within the CAD system. For a transform including a translation matrix, the translation matrix is in a 3×3 matrix format. This requires that the double precision representation of a translation matrix is extended to quadruple precision. This may be done in one of a number of ways, including extending the number of significant digits by adding zeros, similar to zero padding.

If the transform is a rotation matrix, it is necessary to build the transform to a higher precision using the axis-angle information. In this situation, axis and angle snapping may be done directly from the information input by the designer. However, the axis-angle information may not be available directly from the designer input. Upgrading effectively requires reverse engineering of the intentions of the designer who has entered a 3×3 rotation matrix in double precision and representing this accurately in quadruple precision. When upgrading, rather than just converting the rotation matrix from double precision to quadruple precision, the axis-angle formula is used to determine the original rotation parameters.

An axis-angle representation of the rotation matrix is determined to obtain an angle θ of rotation in degrees and an axis of rotation A, both in quadruple precision. This may be done using Rodrigues's formula, wherein, for angles θ of rotation outside the range 175° to 185°, the converting includes solving:

$$R = I + (\sin\theta)K + (1 - \cos\theta)K^2$$

where R is the rotation matrix through the angle of rotation θ about an axis k, I is the identity matrix, and K is the cross-product matrix for the axis k.

At angles in the range 175° to 185°, the converting includes diagonalizing the rotation matrix to generate an eigenvector having a value of 1. This is because at a singularity (sin θ=0) and angles within the proximity of a singularity, dividing by sin θ leads to extremely large numbers. Empirically, this was determined to be with ±5° of 180° by carrying out a number of test cases. In addition, computing the value of cos θ from a 3×3 rotation matrix is also unstable near 0° and 180°, and therefore arctan 2 was used as a replacement for arccos in solving R.

Once the axis-angle conversion has been completed, the angle of rotation θ of the axis-angle representation is snapped to quadruple precision, and, if required, the axis of rotation A of the axis-angle representation is snapped to an axis normalized in quadruple precision. The angle snapping includes computing the angle θ of rotation as an integer fraction of a circle, which when written in degrees corresponds to any fraction a/b, where a is an integer and b is an unsigned integer less than or equal to 100°. This utilizes Farey's sequence in order to determine the original angle θ of rotation parameter. Representing the angle θ of rotation as a fraction of a circle in quadruple precision is more accurate than doing so in either double precision or merely extending double precision to quadruple precision. By limiting the value of the denominator to 100° and using multiples of angles for any rotation where b>100° allows the same methodology to work successfully for quadrilaterals and other regular polygons. The axis snapping considers the twenty-six real-world axes, but in order not to increase computing cost, rather than iterating the axis of rotation A over all twenty-six axes, iterating over a set of absolute value axes normalized in quadruple precision is done instead in order to determine the most appropriate absolute axis to snap to. Having chosen an absolute value axis, the actual axis is found by determining the absolute value of the position of the part with respect to either its local space or its origin, and determining the signs required to convert the absolute values to actual values. Axes may include the world axes and their diagonals.

A transform may also be a combination of a rotation and a reflection, if the number of reflections is even the transform is a proper rotation matrix and may be converted as a rotation, and if the number of reflections is odd the transform is an improper rotation matrix and may be converted as a reflection with a non-zero angle of rotation. Similar to when considering a rotation matrix, a designer enters a 3×3 reflection matrix in double precision. The difference between a rotation matrix and a reflection matrix is that a rotation matrix has a positive determinant, and that a reflection matrix has a negative determinant. Therefore, to begin the conversion process for a reflection matrix, the reflection matrix is multiplied by the negative identity matrix-I to obtain a rotation matrix, and the axis-angle conversion continues as above, before finally multiplying the resulting matrix by the negative identity matrix-I once again. This therefore converts the improper matrix to a proper matrix to carry out the axis snapping and restores the resulting matrix back to the original improper state. The negative identity matrix-I is an improper rotation of 180°, where the axis of rotation is arbitrary. An axis-angle representation of the matrix is determined to obtain an angle θ of rotation of zero and an axis of rotation A in quadruple precision, and the axis of rotation A of the axis-angle representation is snapped to an axis normalized in quadruple precision. The angle θ of rotation is 0°, hence there is no need to carry out an angle snapping act.

Quadruple precision versions of sine and cosine functions may be implemented to improve the accuracy of calculations. Using a similar principle to iterating over seven absolute value axes, angles are pulled into the range $[0, \pi/2]$, on the basis that other quadrants are either equal to or negative to this quadrant. A Taylor series is then computed for sine or cosine, taking advantage of the identity $\sin(x)=\cos(\pi/2-x)$ to obtain a Taylor series with a small parameter. For example, for sin(1.5), instead of computing a Taylor series for sine with 1.5, faster convergence is achieved when computing a Taylor series for cosine with $\pi/2-1.5$. This also enables the Taylor series coefficients to be computed and stored hardcoded in the program code, rather than being computed on-the-fly at runtime.

Figure 8:
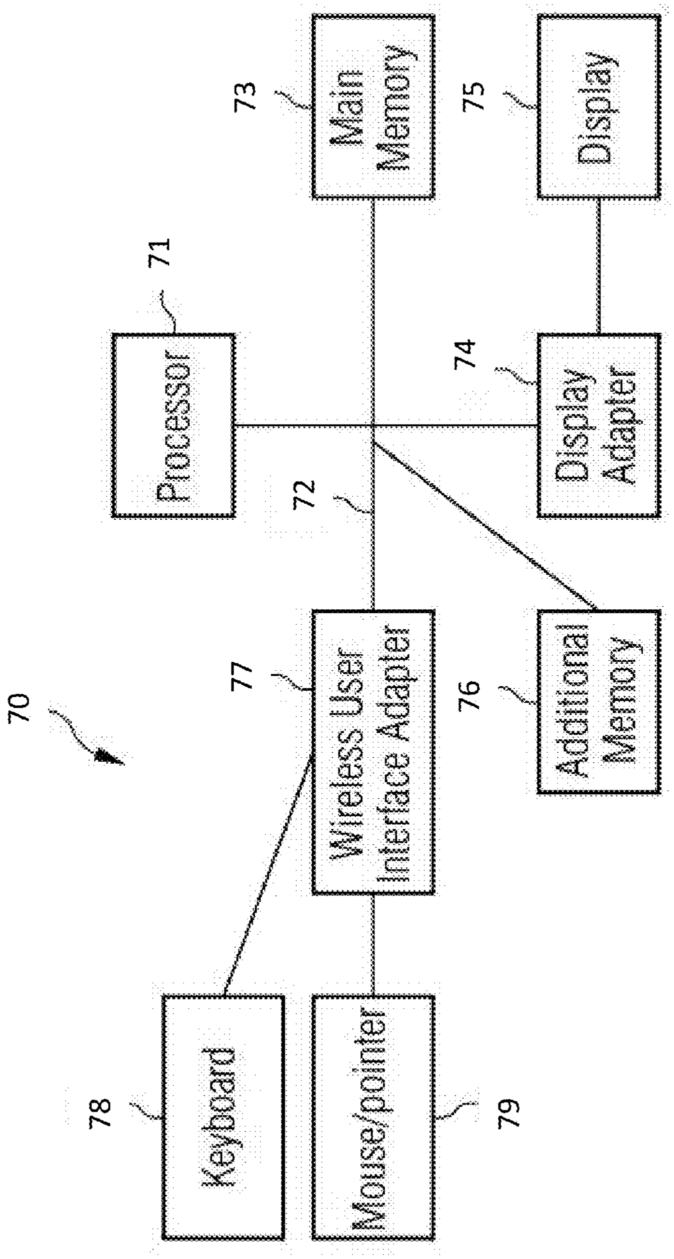
FIG. 8 illustrates an example of a data processing system in which an embodiment of the present disclosure may be implemented, for example, a CAD system configured to perform processes as described herein.

FIG. 8 illustrates an example of a data processing system in which an embodiment of the present disclosure may be implemented, for example, a CAD system configured to perform processes as described herein. The data processing system 70 includes a processor 71 connected to a local system bus 72. The local system bus connects the processor to a main memory 73 and graphics display adaptor 74, which may be connected to a display 75. The data processing system 70 may communicate with other systems via a wireless user interface adapter connected to the local system bus 72, or via a wired network, for example, to a local area network. Additional memory 76 may also be connected via the local system bus. A suitable adaptor, such as wireless user interface adapter 77, for other peripheral devices, such as a keyboard 78 and mouse 79, or other pointing device, allows the user to provide input to the data processing system. Other peripheral devices may include one or more I/O controllers such as USB controllers, Bluetooth controllers, and/or dedicated audio controllers (connected to speakers and/or microphones). Various peripherals may be connected to the USB controller (e.g., via various USB ports) including input devices (for example, keyboard, mouse, touch screen, trackball, camera, microphone, scanners), output devices (for example, printers, speakers), or any other type of device that is operative to provide inputs or receive outputs from the data processing system. Further, in certain examples, devices referred to as input devices or output devices may both provide inputs and receive outputs of communications with the data processing system. Further, other peripheral hardware connected to the I/O controllers may include any type of device, machine, or component that is configured to communicate with a data processing system.

An operating system included in the data processing system 70 enables an output from the system to be displayed to the user on display 75 and the user to interact with the system. Examples of operating systems that may be used in a data processing system 70 may include Microsoft Windows™, Linux™, UNIX™, iOS™, and Android™ operating systems.

In addition, the data processing system 70 may be implemented as in a networked environment, distributed system environment, virtual machines in a virtual machine architecture, and/or cloud environment. For example, the processor 71 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system 70 may vary for particular implementations. For example, the data processing system 70 in this example may correspond to a computer, workstation, and/or a server. However, alternative embodiments of a data processing system 70 may be configured with corresponding or alternative components such as in the form of a mobile phone, tablet, controller board or any other system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

The data processing system 70 may be connected to the network (not a part of data processing system 70), which may be any public or private data processing system network or combination of networks, as known to those of skill in the art, including the Internet. The data processing system 70 may communicate over the network with one or more other data processing systems such as a server (also not part of the data processing system 70). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system 70, such a system may be implemented across several data processing systems organized in a distributed system in communication with each other via a network. Therefore, embodiments of the present disclosure may be implemented in distributed computing networks, such as cloud computing environments.

The embodiments of the present disclosure described above therefore solve the problem of dealing with the limitations of the valid volume of an assembly defined in double precision in a CAD system when rendering two-dimensional images using viewports in a localized manner suitable for use in large, complex, existing software systems. By using quadruple precision only when necessary, the impact of higher precision transformations on performance and memory requirements is significantly reduced. This is due to calculations carried out in quadruple precision having in general worse performance than those carried out in double precision due to lack of intrinsic support and doubled memory requirements. Since any code that is not concerned with the combined transformation may continue to work in double precision, including the intersection calculations for the clipping lines and clipping points, there is no detrimental effect on the overall performance of the system or the experience of the designer.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method of rendering, to a designer, a two-dimensional image of an assembly of part instances in a three-dimensional assembly space within a computer-aided design (CAD) system utilizing double precision to describe part assemblies, wherein each part instance of the part instances in the assembly is associated with a proto-space and a transform that transforms a respective part instance from the proto-space of the respective part instance to the three-dimensional assembly space, the method comprising:

receiving a definition of a two-dimensional image plane in which to view a two-dimensional rendered image and either a viewpoint from which to view the two-dimensional rendered image or a view direction;

receiving a viewport lying in the two-dimensional image plane and representing a desired portion of the two-dimensional image plane that the designer wishes to view;

defining, in a viewport proto-space, a parameterization of a set of viewport planes that extend from the viewport towards the viewpoint or parallel to the view direction to create a three-dimensional form by selecting a point in each viewport plane of the set of viewport planes, wherein the viewport and the set of viewport planes are associated with a transform from the viewport proto-space to the three-dimensional assembly space;

generating, in quadruple precision, a combined transform comprising a transform associated with the part instance in the assembly, the transform associated with the viewport and the set of viewport planes, and a transform to scale the viewport and/or translate the viewport and the set of viewport planes;

operating on the combined transform and the points defining the viewport planes in double precision to intersect faces and/or edges of at least one part instance in the assembly with at least one of the viewport planes to generate clipping lines and/or clipping points, wherein the clipping lines and the clipping points clip the faces and the edges of the part instance in the assembly to a portion of the assembly that lies within the viewport; and outputting a rendering of the two-dimensional image of the assembly of part instances, wherein the clipping lines and/or the clipping points are used to restrict the rendering to portions of the assembly that lie within the viewport.

2. The method of claim 1, wherein the transform associated with the part instance in the assembly and the transform associated with the viewport and the set of viewport planes are provided in quadruple precision.

3. The method of claim 1, wherein the transform associated with the part instance in the assembly and the transform associated with the viewport and the set of viewport planes are upgraded to quadruple precision.

4. The method of claim 1, wherein the two-dimensional image is rendered as a perspective view, wherein an eye point defining a position of an observer at the viewpoint is also received, and wherein the three-dimensional form is a pyramid having the viewport at a base of the three-dimensional form and the eye point at an apex of the three-dimensional form.

5. The method of claim 4, wherein the combined transform comprises:

the transform associated with the part instance in the assembly;

the transform associated with the viewport and the set of viewport planes; and a transform to scale the viewport and the set of viewport planes.

6. The method of claim 1, wherein the two-dimensional image is rendered as a parallel view, and wherein the three-dimensional form is a prism having the viewport as a base of the three-dimensional form.

7. The method of claim 6, wherein the two-dimensional image is rendered as a parallel view, and wherein the three-dimensional form is a cuboid having the viewport as a base of the three-dimensional form.

8. The method of claim 7, wherein the combined transform comprises:

the transform associated with the part instance in the assembly;

the transform associated with the viewport and the set of viewport planes; and a transform to translate the viewport and the set of viewport planes.

9. The method of claim 6, wherein the combined transform comprises:

the transform associated with the part instance in the assembly;

the transform associated with the viewport and the set of viewport planes; and a transform to translate the viewport and the set of viewport planes.

10. The method of claim 1, wherein the view direction lies parallel to a surface normal of the two-dimensional image plane.

11. The method of claim 1, wherein a valid volume for the three-dimensional assembly space and the points defining the parameterization of the viewport planes are limited to a system operating region, and wherein at least one part instance of the part instances in the assembly lies outside of the system operating region.

12. The method of claim 1, wherein one face of the faces of the part instance in the assembly clipped to the viewport contains a feature of interest.

13. The method of claim 1, wherein the quadruple precision is only employed when generating the combined transform.

14. A non-transitory computer readable medium having computer program comprising instructions that, when executed on a computer, cause the computer to:

receive a definition of a two-dimensional image plane in which to view a two-dimensional rendered image and either a viewpoint from which to view the two-dimensional rendered image or a view direction;

receive a viewport lying in the two-dimensional image plane and representing a desired portion of the two-dimensional image plane that a designer wishes to view;

define, in a viewport proto-space, a parameterization of a set of viewport planes that extend from the viewport towards the viewpoint or parallel to the view direction to create a three-dimensional form by selecting a point in each viewport plane of the set of viewport planes, wherein the viewport and the set of viewport planes are associated with a transform from the viewport proto-space to a three-dimensional assembly space;

generate, in quadruple precision, a combined transform comprising a transform associated with a part instance in an assembly, the transform associated with the viewport and the set of viewport planes, and a transform to scale the viewport and/or translate the viewport and the set of viewport planes;

operate on the combined transform and the points defining the viewport planes in double precision to intersect faces and/or edges of at least one part instance in the assembly with at least one of the viewport planes to generate clipping lines and/or clipping points, wherein the clipping lines and the clipping points clip the faces and the edges of the part instance in the assembly to a portion of the assembly that lies within the viewport; and output a rendering of a two-dimensional image of the assembly of part instances, wherein the clipping lines and/or the clipping points are used to restrict the rendering to portions of the assembly that lie within the viewport.

15. A data processing system configured to render, to a designer, a two-dimensional image of an assembly of part instances in a three-dimensional assembly space within a computer-aided design (CAD) system utilizing double precision to describe part assemblies, wherein each part instance of the part instances in the assembly is associated with a proto-space and a transform that transforms a respective part instance from the proto-space of the respective part instance to the three-dimensional assembly space, the data processing system comprising:

a designer input device configured to:

receive a definition of a two-dimensional image plane in which to view a two-dimensional rendered image and either a viewpoint from which to view the two-dimensional rendered image or a view direction; and receive a viewport lying in the two-dimensional image plane and representing a desired portion of the two-dimensional image plane that the designer wishes to view;

a data processor configured to:

define, in a viewport proto-space, a parameterization of a set of viewport planes that extend from the viewport towards the viewpoint to create a three-dimensional form by selecting a point in each viewport plane of the set of viewport planes, and the viewport and the set of viewport planes being associated with a transform from the viewport proto-space to the three-dimensional assembly space;

generate, in quadruple precision, a combined transform comprising a transform associated with the part instance in the assembly, the transform associated with the viewport and the set of viewport planes, and a transform to scale the viewport and/or translate the viewport and the set of viewport planes; and operate on the combined transform and the points defining the viewport planes in double precision to intersect faces and/or edges of at least one part instance in the assembly with at least one of the viewport planes to generate clipping lines and/or clipping points, wherein the clipping lines and the clipping points clip the faces and the edges of the part instance in the assembly to a portion of the assembly that lies within the viewport; and a graphics system configured to output a rendering of the two-dimensional image of the assembly of part instances, wherein the clipping lines and/or the clipping points are used to restrict the rendering to portions of the assembly that lie within the viewport.

16. The data processing system of claim 15, wherein the data processor is further configured to employ quadruple precision only when generating the combined transform.

* * * * *